United States Patent
Tseng et al.

(10) Patent No.: US 8,633,730 B1
(45) Date of Patent: Jan. 21, 2014

(54) POWER CONTROL USING GLOBAL CONTROL SIGNAL TO SELECTED CIRCUITRY IN A PROGRAMMABLE INTEGRATED CIRCUIT

(75) Inventors: Chen W. Tseng, Longmont, CO (US); Weiguang Lu, San Jose, CA (US); William W. Stiehl, Lafayette, CO (US); Robert M. Balzli, Jr., Longmont, CO (US); Carl M. Stern, Boulder, CO (US); Aditya Chaubal, Longmont, CO (US); Derrick S. Woods, Loveland, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/588,435

(22) Filed: Aug. 17, 2012

(51) Int. Cl.
*H03K 19/173* (2006.01)
*H03K 19/177* (2006.01)
*G06F 1/24* (2006.01)
*G06F 17/50* (2006.01)

(52) U.S. Cl.
USPC ............... 326/38; 326/40; 713/100; 716/138

(58) Field of Classification Search
USPC .................. 326/37–41, 47; 713/100; 716/138
See application file for complete search history.

(56) References Cited

U.S. PATENT DOCUMENTS

| | | | |
|---|---|---|---|
| 5,946,478 A | 8/1999 | Lawman | |
| 5,991,523 A | 11/1999 | Williams et al. | |
| 6,255,848 B1 * | 7/2001 | Schultz et al. | 326/41 |
| 6,262,596 B1 * | 7/2001 | Schultz et al. | 326/41 |
| 6,493,862 B1 | 12/2002 | Young et al. | |
| 6,526,557 B1 | 2/2003 | Young et al. | |
| 6,907,595 B2 | 6/2005 | Curd et al. | |
| 7,098,689 B1 | 8/2006 | Tuan et al. | |
| 7,301,822 B1 | 11/2007 | Walstrum, Jr. et al. | |
| 7,562,332 B1 | 7/2009 | Tuan et al. | |
| 7,581,124 B1 | 8/2009 | Jacobson et al. | |
| 7,589,558 B1 * | 9/2009 | Tseng et al. | 326/41 |
| 7,620,926 B1 | 11/2009 | Tuan | |
| 7,973,556 B1 * | 7/2011 | Noguera Serra et al. | 326/38 |
| 8,099,691 B1 * | 1/2012 | Tuan et al. | 716/100 |
| 8,271,924 B1 | 9/2012 | Orthner et al. | |
| 8,415,974 B1 | 4/2013 | Lysaght | |
| 2005/0193358 A1 | 9/2005 | Blodget et al. | |
| 2005/0248364 A1 | 11/2005 | Vadi et al. | |
| 2009/0219051 A1 | 9/2009 | Zhang et al. | |

OTHER PUBLICATIONS

Hussein, Jameel, et al., Lowering Power at 28 nm with Xilinx 7 Series, White Paper: 7 Series FPGAs, WP389 (v1.1.1.) Feb. 17, 2012, pp. 1-25, Xilinx, Inc., San Jose, California USA.
U.S. Appl. No. 13/588,647, filed Aug. 17, 2012, Weiguang Lu, Xilinx, Inc., 2100 Logic Drive, San Jose, CA USA.

\* cited by examiner

*Primary Examiner* — Shawki Ismail
*Assistant Examiner* — Dylan White
(74) *Attorney, Agent, or Firm* — LeRoy D. Maunu

(57) ABSTRACT

When a first sub-circuit of a programmable integrated circuit ("IC") is to be deactivated, a global write enable (GWE) signal is deasserted. In response to deassertion of the GWE signal and a first memory cell associated with the first sub-circuit being in a first state, flip-flops in the first sub-circuit are disabled from changing state. In response to memory cells associated with sub-circuits other than the first sub-circuit being in a second state, flip-flops in the other sub-circuits are enabled to change state. When the first sub-circuit is to be activated, the GWE signal is asserted. Logic implemented by the first sub-circuit is preserved between the deasserting and the asserting of the GWE signal. In response to assertion of the GWE signal and the first memory cell associated with the first sub-circuit being in the first state, flip-flops in the first sub-circuit are enabled to change state.

20 Claims, 5 Drawing Sheets

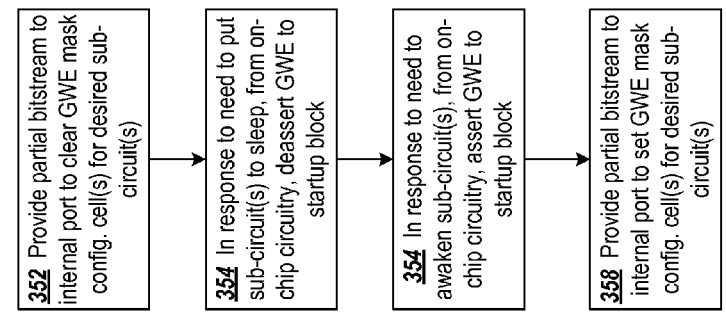
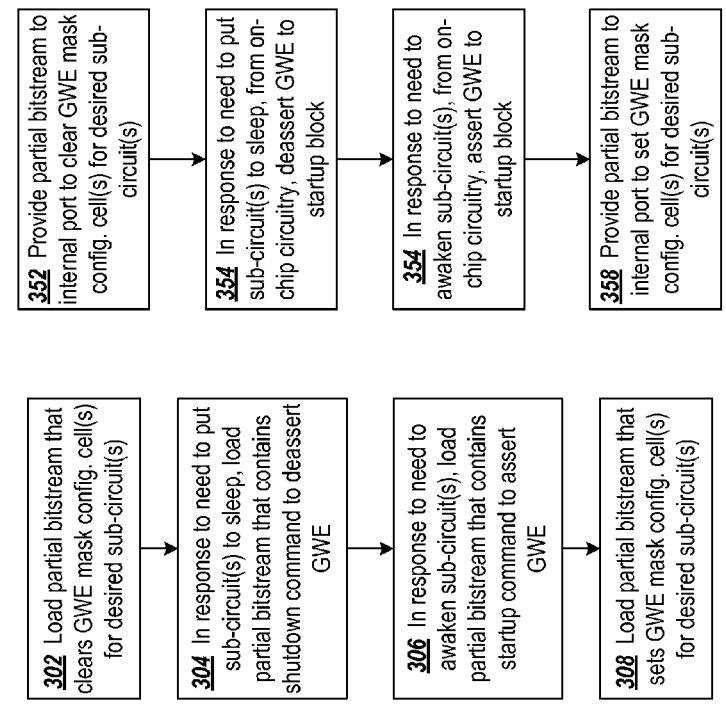
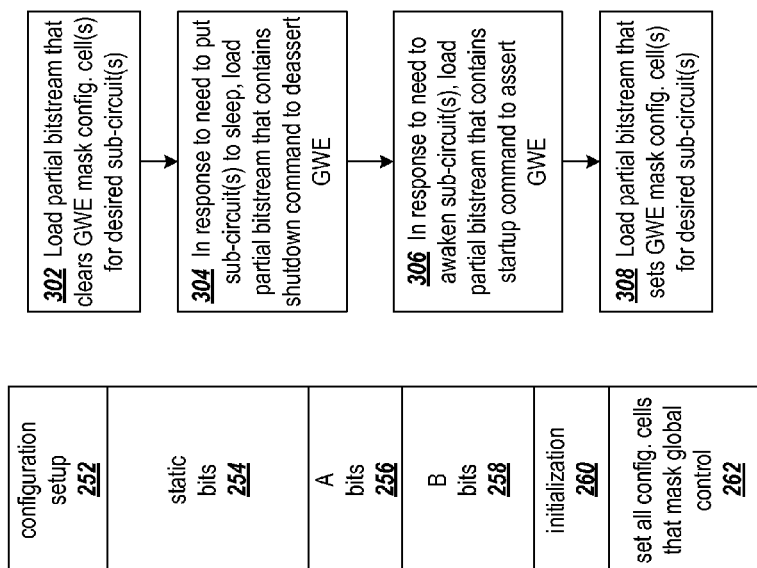
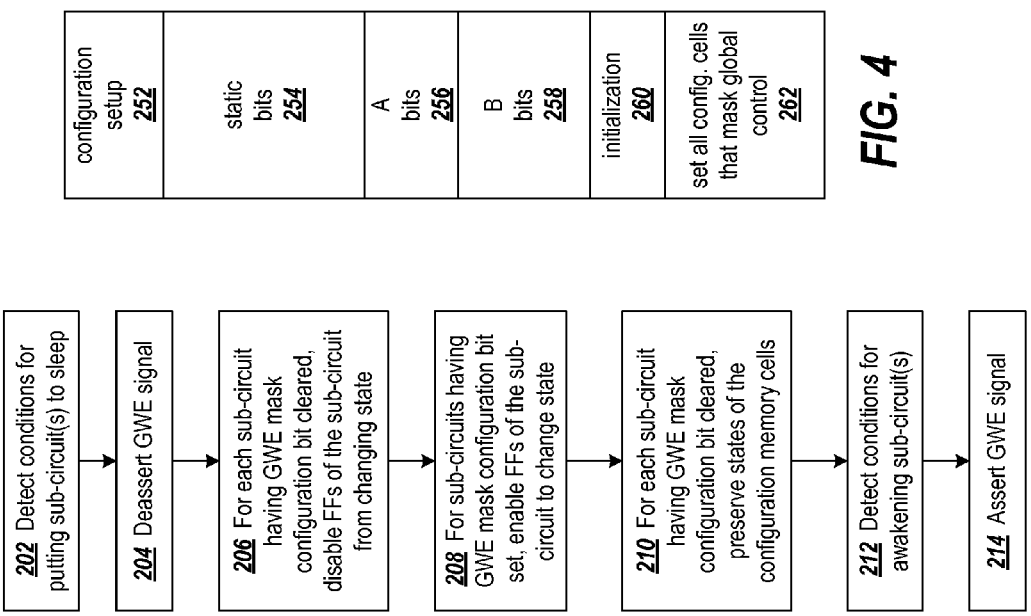
FIG. 3
FIG. 4
FIG. 5
FIG. 6

POWER CONTROL USING GLOBAL CONTROL SIGNAL TO SELECTED CIRCUITRY IN A PROGRAMMABLE INTEGRATED CIRCUIT

FIELD OF THE INVENTION

One or more embodiments generally relate to reducing dynamic power consumption in a sub-circuit of a programmable integrated circuit.

BACKGROUND

Programmable logic devices (PLDs) are a well-known type of programmable IC that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Programmable ICs are used in many applications, such as mobile, aerospace and defense applications, where power consumption is often a critical design issue. The dynamic power consumption of an electronic circuit contributes substantially to the overall power consumption. Current approaches for reducing dynamic power consumption may not provide the desired results, may be time-consuming or may complicate design considerations.

Partial reconfiguration of a programmable IC has been used to deactivate (or "put to sleep") a module and thereby reduce dynamic power consumption. In this approach, the area of the programmable IC that is occupied by the module that is to be put to sleep is reconfigured with a "blank" module. The blank module is non-responsive to input signals so that flip-flops in the area of the programmable IC that is occupied by the blank module do not change state. The blank module approach requires storage for the blank bitstream and may require more time than is desirable for scenarios in which a short sleeping period is desired.

In another approach, dynamic power consumption may be reduced by gating the clock signal input to the portion(s) of the programmable IC occupied by the module to be put to sleep. This approach requires the designer to include clock gating logic as part of the overall design.

SUMMARY

In one embodiment, a method of controlling power to a circuit is provided. The method includes, in response to determining that a first sub-circuit of a plurality of sub-circuits of a programmable IC is to be deactivated, deasserting a global write enable (GWE) signal. The programmable IC includes a first plurality of configuration memory cells, and each configuration memory cell of the first plurality is associated with one sub-circuit of the plurality of sub-circuits and controls whether or not the sub-circuit is responsive to the GWE signal. In response to deassertion of the GWE signal and the first cell associated with the first sub-circuit being in the first state, flip-flops in the first sub-circuit are disabled from changing state. In response to cells of the first plurality associated with sub-circuits other than the first sub-circuit being in the second state, flip-flops in the sub-circuits other than the first sub-circuit are enabled to change state. In response to determining that the first sub-circuit is to be activated, the GWE signal is asserted. Logic implemented by the first sub-circuit is preserved between the deasserting and the asserting of the GWE signal. In response to assertion of the GWE signal and the first cell associated with the first sub-circuit being in the first state, flip-flops in the first sub-circuit are enabled to change state.

In another embodiment, a method of generating an implementation of a circuit for a programmable integrated circuit (IC) from a circuit design having a plurality of modules is provided. The method includes using one of more processors to perform operations including generating a configuration bitstream that includes configuration data that configures a plurality of configuration memory cells of the programmable IC to implement the circuit design. In response to a first module of the plurality of modules designated as supporting a sleep mode, the method generates a first partial bitstream that clears one or more respective mask configuration memory cells associated with one or more sub-circuits of the programmable IC that implement the first module. A state of the mask configuration memory cell controls whether or not the sub-circuit is responsive to a global write enable (GWE) signal. A second partial bitstream that includes a command that deasserts the GWE signal is generated. A third partial bitstream that sets the one or more respective mask configuration memory cells is generated. A fourth second partial bitstream that includes a command that asserts the GWE signal is generated.

An integrated circuit (IC) arrangement is provided in another embodiment. The IC arrangement includes a plurality of programmable sub-circuits, and each sub-circuit includes one or more flip-flops. A plurality of configuration memory cells is coupled to the programmable sub-circuits. For each sub-circuit, states of configuration memory cells in a respective subset of the configuration memory cells specify a function implemented by the sub-circuit. A state of a first one of the plurality of configuration memory cells respectively associated with the sub-circuit controls whether or not the one or more flip-flops in the sub-circuit is responsive to a global write enable (GWE) signal, and the GWE signal controls whether or not the one or more flip-flops in the sub-circuit can change state. A state of a second one of the plurality of configuration memory cells respectively associated with the sub-circuit controls whether or not the respective subset of configuration memory cells associated with the sub-circuit is eligible for partial reconfiguration.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which:

FIG. 3 is a flowchart of an example process for putting to sleep and waking a sub-circuit on a programmable IC;

FIG. 4 shows a full configuration bitstream for initializing a programmable IC in one scenario for putting to sleep and waking a sub-circuit on a programmable IC;

FIG. 5 shows a flowchart of a process for putting to sleep and waking a sub-circuit on a programmable IC by loading partial bitstreams;

FIG. 6 shows a flowchart of a process for putting to sleep and waking a sub-circuit on a programmable IC by accessing the startup block on the programmable IC;

DETAILED DESCRIPTION OF THE DRAWINGS

Figure 1:
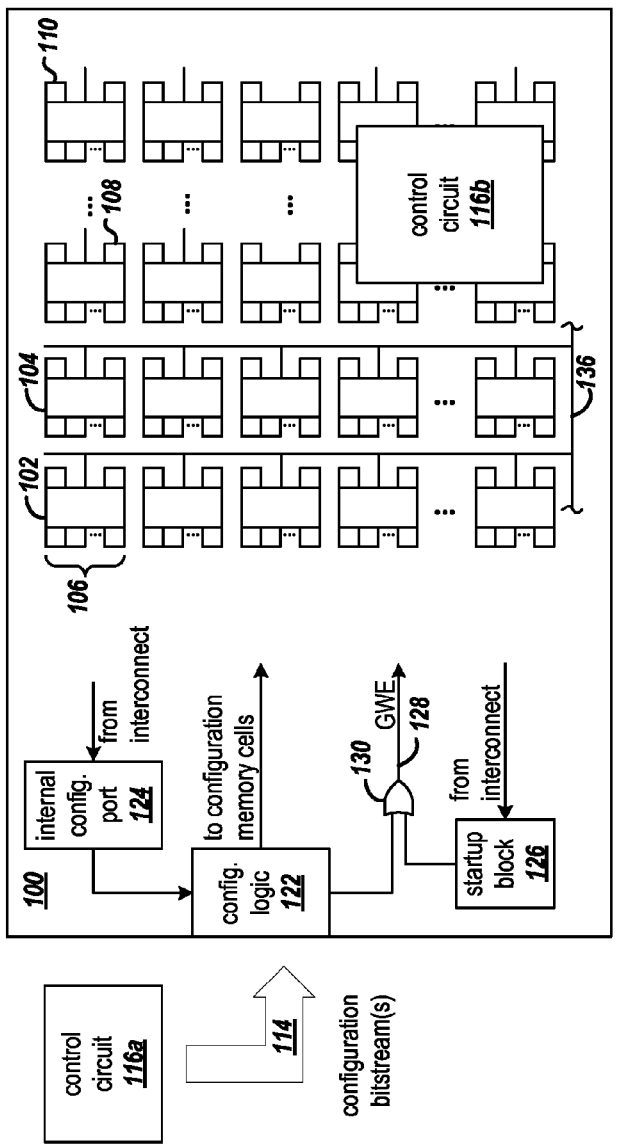
FIG. 1 is an example programmable integrated circuit having multiple sub-circuits to which dynamic power may be individually controlled.

In some programmable ICs, such as field programmable gate arrays from Xilinx, all the synchronous configurable primitive circuits ("primitives") in the IC are responsive to global control signals such as global write enable (GWE), global set/reset (GSR), or global tri-state (GTS, IO only). In prior programmable ICs, selected ones of the primitives could be shielded from the effects of the global control signals. By suitably programming a mask configuration memory cell associated with a set of the primitives, the mask configuration memory cell masks the effect of the global control signals on those primitives.

The GWE signal has been used in support of partial reconfiguration of programmable ICs. The GWE signal can be used to prevent flip-flops from changing state during partial reconfiguration. When the GWE signal is asserted, primitives such as flip-flops can change state in response to application data signals. When the GWE signal is de-asserted, the flip-flops cannot change state. If the mask configuration memory cell that is associated with certain flip-flops is in a state to mask the GWE signal, those flip-flops can change state regardless of the state of the GWE signal. Thus, in a partial reconfiguration scenario, the mask configuration memory cells that are associated with areas of the programmable IC that are not undergoing partial reconfiguration will be set to mask the effects of the GWE signal. The mask configuration memory cells that are associated with areas of the programmable IC that are undergoing partial reconfiguration will be cleared and the flip-flops in those areas will be affected by the state of the GWE signal. During partial reconfiguration, the GWE may be de-asserted to preserve the state (e.g., application data) of the flip-flops in the portion of the programmable IC undergoing reconfiguration.

In prior programmable ICs, the mask configuration memory cell used for masking a global partial reconfiguration signal was also used for masking the GWE signal. Partial reconfiguration of programmable ICs, such as those from Xilinx, is often performed on a frame-by-frame basis. Thus, each frame had an associated partial reconfiguration mask configuration memory cell.

In one or more embodiments, there are separate configuration memory cells for the GWE mask and the partial reconfiguration mask. Thus, GWE masking can be exercised independent of partial reconfiguration masking. To reduce dynamic power consumption, the masking of GWE is used to control write enable of the synchronous logic of a module to be put to sleep in order to prevent the logic from toggling. Through use of GWE mask configuration memory cells and control of the GWE signal, dynamic power consumption may be reduced by putting selected circuitry to sleep. That is, flip-flops in areas of the programmable IC in which a selected module is implemented may be stopped from changing state through the GWE mask configuration memory cells and the GWE signal.

The embodiments provide a mechanism for putting a module to sleep without changing the underlying design. That is, no change to the design is required for clock gating and no partial reconfiguration of areas of the programmable IC is required. In addition, modules of the circuit design that may be put to sleep and modules that may not be put to sleep may be in the same clock domain. The GWE signal and GWE mask configuration memory cells may be used to put one module to sleep and not affect the other modules.

FIG. 1 is an example programmable integrated circuit 100 having multiple sub-circuits (e.g., tiles of an FPGA which may include programmable logic) to which dynamic power may be individually controlled. Blocks 102 and 104 are examples of the sub-circuits. Each sub-circuit has an associated set of configuration memory cells. For example, sub-circuit 102 is associated with configuration memory cells 106. For some types of sub-circuits, the states of the configuration memory cells specify the logic function of the associated sub-circuit. For other sub-circuits, the states of the configuration memory cells provide operating parameters for the associated sub-circuit.

Each sub-circuit also has an associated GWE mask configuration memory cell, such as memory cell 108, and a partial reconfiguration (PR) mask configuration memory, such as memory cell 110. The GWE mask configuration memory cell masks the effect of the GWE signal on flip-flops in the associated sub-circuit. That is, if the GWE mask configuration memory cell is set, the flip-flops in the sub-circuit change state according to the implemented design, regardless of the state of the GWE signal. If the GWE mask configuration memory cell is cleared, the flip-flops in the sub-circuit change state according to the implemented design if the GWE signal is asserted, and the flip-flops in the sub-circuit will not change state according to the implemented design if the GWE signal is deasserted.

The PR mask configuration memory cell 110 masks the effect of partial reconfiguration on configuration memory cells associated with the sub-circuit. That is, if the PR mask configuration memory cell is set, the configuration memory cells associated with a sub-circuit cannot be reconfigured even if addressed by a configuration bitstream. If the PR mask configuration memory cell is cleared, the configuration memory cells associated with a sub-circuit can be reconfigured if addressed by a configuration bitstream.

Two approaches are disclosed for putting to sub-circuits that implement a module of a design into a sleep mode. In one approach, very small and highly compressible partial reconfiguration bitstreams 114 may be input by control circuit 116*a* to configure the GWE mask configuration memory cells into the desired states and assert the GWE signal. Control circuit 116*a* is implemented external to the programmable IC 100. For example, the control circuit 116*a* may be on a separate die or package from the programmable IC 100. In another approach, a control circuit 116b implemented on the programmable IC can be used to provide partial reconfiguration bitstreams to configure the GWE mask configuration memory cells into the desired states and assert the GWE signal.

With the first approach, configuration bitstreams are input to the configuration logic 122 for configuring configuration memory cells of the programmable IC. An initial configuration bitstream configures the configuration memory cells (e.g., 106) into desired states for implementing a circuit design. The configuration memory cells that are associated with all the sub-circuits needed to implement the circuit design (or a portion thereof) are configured. The initial configuration bitstream may also configure the GWE mask configuration memory cells (e.g., 108) of the sub-circuits into a state that masks the effect of the GWE signal. While an implemented design, or a portion thereof, is operating in the programmable IC, and when it is determined that a module of a circuit design can be put to sleep (as would vary from application to application), a small and highly compressible partial reconfiguration bitstream is input to clear the associated GWE mask configuration memory cell(s) and initiate a shutdown sequence. The shutdown sequence deasserts the GWE signal. Since only the sub-circuit(s) to be put to sleep has the associated GWE mask configuration memory cell(s) cleared, only the flip-flops in that sub-circuit(s) will be stopped from changing state in response to the GWE signal being deasserted.

In the second approach, a control circuit (not shown) implemented on the programmable IC can be used to provide partial reconfiguration bitstreams to configure the GWE mask configuration memory cells into the desired states and assert the GWE signal. The control circuit may be implemented on either an embedded processor or in programmable logic of the programmable IC.

The control circuit is coupled to an internal configuration port 124 via programmable interconnect (not shown) of the programmable IC, and the internal configuration port is coupled to the configuration logic. Via the programmable interconnect, the control circuit provides partial reconfiguration bitstreams to the internal configuration port and configuration logic to set and clear the states of one or more GWE mask configuration memory cells.

Programmable IC 100 further includes a startup block circuit 126. In some programmable ICs, such as some FPGAs from Xilinx, the startup block provides application circuitry with access to the various functions that are available during the startup phase of the device's operation, including the GWE, GSR and GTS signals. The startup block may be a small cell whose pins are accessible via connections to the programmable interconnect. Connecting a signal such as GWE to a pin of the start-up block introduces that signal to the appropriate global network on the programmable IC. The GWE signal on line 128 may be controlled via configuration logic 122 or startup block 126 as shown by OR gate 130.

In some programmable ICs, such as FPGAs from Xilinx, sub-circuits such as block RAMS (BRAMS) may have separate static power control circuitry. Thus, in combination with the dynamic power control approaches described herein, additional partial bitstreams may be generated and used to put the BRAM circuits into a sleep mode.

Having respective GWE mask configuration memory cells associated with the sub-circuits of the programmable IC supports dynamic power control over sub-circuits that are within the same clock domain. For example, sub-circuits 102 and 104 are within the same shared clock domain as represented by the connection to clock signal line 136. Sub-circuit 102 may be put to sleep while sub-circuit 104 remains active.

Since sub-circuit 102 and sub-circuit 104 each has its own GWE mask configuration memory cell, the GWE signal can be masked for one of the sub-circuits and not for the other.

Figure 2:
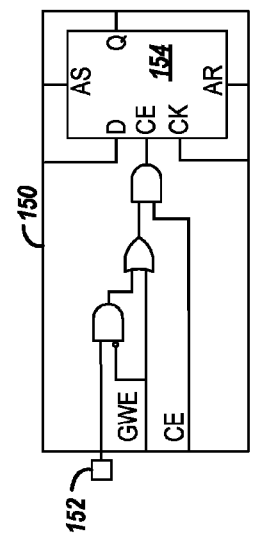
FIG. 2 is an example of one of the multiple flip-flops that is an element within each of the configurable sub-circuits.

FIG. 2 is an example of one of the multiple flip-flops that is an element within each of the configurable sub-circuits. Flip-flop 150 is a D-type flip-flop in one embodiment and includes logic circuitry for masking the GWE signal. The state of GWE mask configuration memory cell 152 controls whether or not the GWE signal is masked to the CE input of the storage circuit 154. AS and AR pins are provided for asynchronous set and asynchronous reset, respectively. The GSR signal to the AS and AR inputs may also be masked though the logic is not shown.

FIG. 3 is a flowchart of an example process for putting to sleep and waking a sub-circuit on a programmable IC. At block 202 conditions are detected for putting one or more sub-circuit(s) to sleep. The conditions that signal a sub-circuit is to be put to sleep will vary between different designs. The control circuitry that detects the conditions may be implemented on the programmable IC having the sub-circuit(s) to be put to sleep. The programmable IC may include a hard-wired microprocessor or a soft processor that is implemented in programmable logic and routing resources of the programmable IC. Alternatively, the control circuitry may be off-chip and external to the programmable IC.

In response to detecting the need to put one or more sub-circuit(s) to sleep, the GWE signal is deasserted at block 204. For each sub-circuit having the associated GWE mask configuration memory cell cleared, flip-flops of the sub-circuit are disabled from changing state at block 206. Since these flip-flops will not change state in response to application input, dynamic power consumption will be reduced for the time period during which the GWE signal is deasserted.

For sub-circuits having the associated GWE mask configuration memory cell set, the flip-flops of the sub-circuit are enabled to change state in response to data inputs at block 208.

At block 210, the configurable logic in those sub-circuit(s) that were put to sleep is preserved over the time that the sub-circuit(s) sleeps. In other words, the states of the configuration memory cells are preserved while the sub-circuit is sleeping. Thus, whereas the GWE signal has been used in prior systems to preserve the state of flip-flops in a portion of the programmable IC during partial reconfiguration (wherein the configuration memory cells are reprogrammed), in the present method and system, the GWE signal and GWE mask configuration memory cell are used to stop the flip-flops in the portion of the programmable IC from changing state and thereby reduce dynamic power consumption while the rest of the programmable IC is operating according to the design.

At block 212, conditions are detected for awakening the sub-circuit(s), and at block 214, the GWE signal is asserted. Once the GWE signal is asserted, the flip-flops in the formerly sleeping sub-circuit(s) will be enabled to change state in response to data inputs from the application.

FIG. 4 shows a full configuration bitstream for initializing a programmable IC in one scenario for putting to sleep and waking a sub-circuit on a programmable IC. The configuration bitstream includes a configuration setup portion 252, configuration data portions 254, 256, and 258 for programming configuration memory cells in different parts of the programmable IC, an initialization portion 260, and a masking portion 262.

The configuration setup portion 252 includes data for synchronizing input of the configuration bitstream to the programmable IC. In addition, the configuration setup portion 252 may include control packets and header information for directing the programmable IC in the loading of configuration data.

The configuration data includes static bits 254, A bits 256, and B bits 258. The static bits 254, A bits 256, and B bits 258 represent the configuration data for an example design having a static portion, and portions (or "modules") A and B which may be put to sleep. The configuration data is used to program configuration memory cells that are associated with the sub-circuits of the programmable IC.

The initialization data 260 includes additional control packets and startup commands for causing the programmable IC to begin operating with the programmed circuitry.

The masking portion 262 includes configuration data for setting the GWE mask configuration memory cells. In one example scenario, the GWE mask configuration memory cells are set for all the sub-circuits used in implementing the design. This effectively shields all those sub-circuits from the effects of changes in state in the GWE signal.

FIG. 5 shows a flowchart of a process for putting to sleep and waking a sub-circuit on a programmable IC by loading partial bitstreams. The process of FIG. 5 assumes that the programmable IC initially has GWE mask configuration memory cells for all the sub-circuits used in implementing the design in a set state. In response to determining that a module of the circuit design is to be put to sleep, at block 302 the process loads a partial configuration bitstream that clears the GWE mask configuration memory cell(s) that is associated with the sub-circuit(s) that implements the module to be put to sleep.

Using the configuration bitstream of FIG. 4 as an example, the GWE mask configuration memory cells associated with the sub-circuits of the programmable IC used to implement the static, A, and B portions of the design are initially set. If the A portion of the design is to be put to sleep, the GWE mask configuration memory cell(s) that are associated with the sub-circuit(s) that implement the A portion are cleared at block 302.

At block 304, a partial bitstream is input to the programmable IC, and the partial bitstream contains a shutdown command. The shutdown command causes the programmable IC to deassert the GWE signal. In response to the GWE signal being deasserted, flip-flops in those sub-circuits for which the associated GWE mask configuration memory cell is not set, such as the sub-circuit(s) that implements the A portion, will not change state. The flip-flops in the sub-circuits for which the GWE mask configuration memory cell is set, such as the sub-circuits that implement the static and B portions, are enabled to change state in response to data inputs.

In response to determining that a sleeping portion of the circuit, such as the A portion, is to be awakened, at block 306, a partial bitstream containing a startup command is loaded. The startup command causes the programmable IC to assert the GWE signal. In response to the GWE signal, the flip-flops in the sub-circuit(s) having the GWE mask configuration memory cell cleared, can change state in response to data input.

Block 308 specifies processing that is optional and depends on application requirements. If an application requires other sub-circuits to be put to sleep without putting to sleep the sub-circuit just awakened, a partial configuration bitstream may be input to set the GWE mask configuration memory cell of the just-awakened sub-circuit. For example, the GWE mask configuration memory cell(s) associated with the sub-circuit(s) that implement the A portion of the design may be set after the GWE signal is asserted to awaken portion A. To put another part of the circuit to sleep, such as the sub-circuit(s) that implement portion B, the process may return to block 302 to clear the GWE mask configuration memory cell for the sub-circuit(s) that implement portion B. Since the GWE mask configuration memory cell for the sub-circuit(s) that implement portion A have been set, the sub-circuit(s) that implement portion A are now protected from effects of deassertion of the GWE signal.

Since only small or compressed partial bitstreams are used to control the setting and clearing of the GWE mask configuration memory cells and to deassert and assert the GWE signal, storage space is saved and the time required to put a module to sleep and then awaken the module is greatly reduced as compared to prior approaches which involve much larger bitstreams. The small or compressed bitstreams may be encrypted, and time may be saved in having to decrypt only a small bitstream.

FIG. 6 shows a flowchart of a process for putting to sleep and waking a sub-circuit on a programmable IC by accessing the startup block on the programmable IC. The process of FIG. 6 assumes that the programmable IC initially has GWE mask configuration memory cells for all the sub-circuits used in implementing the design in a set state. In response to determining that a module of the circuit design is to be put to sleep, at block 352 the process provides partial configuration bitstream that clears the GWE mask configuration memory cell(s) that is associated with the sub-circuit(s) that implements the module to be put to sleep. The partial bitstream is provided via interconnect of the programmable IC to the internal configuration port 124. The source of the partial bitstream may be a circuit that is implemented in programmable logic, an embedded processor, or hardwired logic circuitry that is disposed on the same chip as the programmable logic.

At block 354, a signal is transmitted from circuitry on the programmable IC to the startup block 126 of the programmable IC to deassert the GWE signal. The source of the signal to the startup block may be the same as the source of the partial bitstream for clearing the GWE mask configuration memory cell. In response to the GWE signal being deasserted, flip-flops in those sub-circuits for which the associated GWE mask configuration memory cell is not set, such as the sub-circuit(s) that implements the A portion, will not change state. The flip-flops in the sub-circuits for which the GWE mask configuration memory cell is set, such as the sub-circuits that implement the static and B portions, are enabled to change state in response to data inputs.

In response to determining that a sleeping portion of the circuit, such as the A portion, is to be awakened, at block 356, a signal is asserted to the startup block in order to assert the GWE signal. In response to the GWE signal, the flip-flops in the sub-circuit(s) having the GWE mask configuration memory cell cleared, can change state in response to data input.

Block 358 specifies processing that is optional and depends on application requirements. If an application requires other sub-circuits to be put to sleep without putting to sleep the sub-circuit just awakened, a partial configuration bitstream may be input to the internal configuration port to set the GWE mask configuration memory cell of the just-awakened sub-circuit. For example, the GWE mask configuration memory cell(s) associated with the sub-circuit(s) that implement the A portion of the design may be set after the GWE signal is asserted to awaken portion A. To put another part of the circuit to sleep, such as the sub-circuit(s) that implement portion B, the process may return to block 352 to clear the GWE mask configuration memory cell for the sub-circuit(s) that implement portion B. Since the GWE mask configuration memory cell for the sub-circuit(s) that implement portion A have been set, the sub-circuit(s) that implement portion A are now protected from effects of deassertion of the GWE signal.

Figure 7:
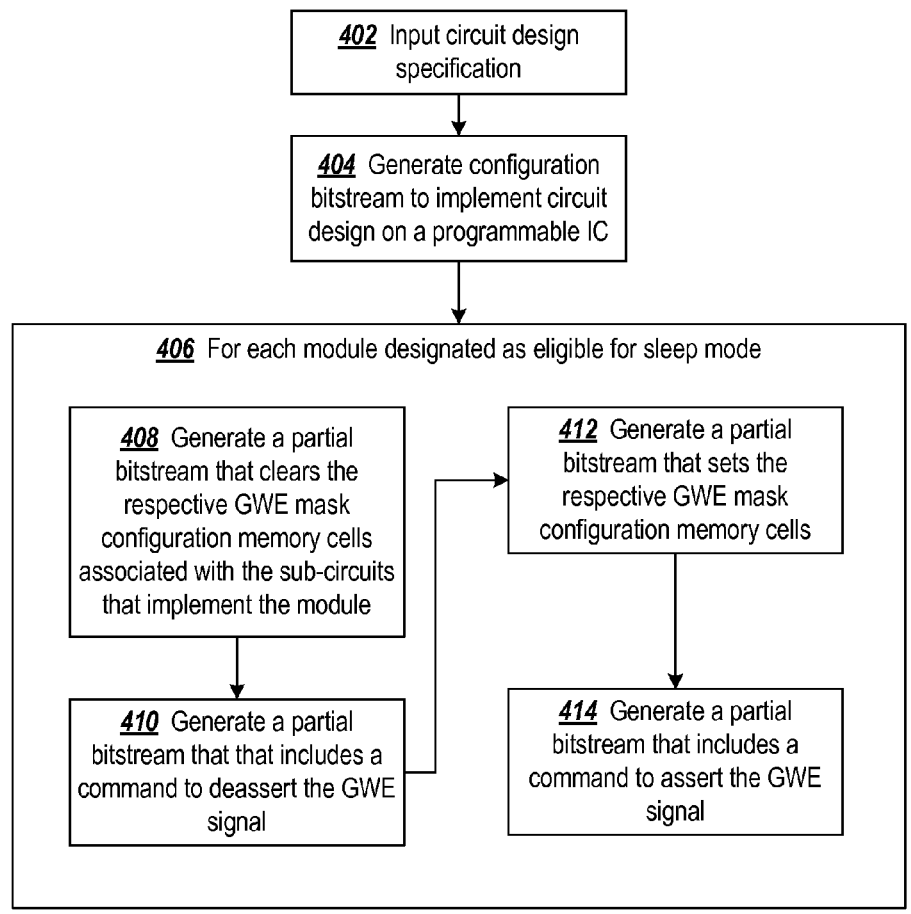
FIG. 7 shows a flowchart of a process for generating an implementation of a circuit for which one or more modules are eligible to be put to sleep and awakened.

FIG. 7 shows a flowchart of a process for generating an implementation of a circuit for which one or more modules are eligible to be put to sleep and awakened. At block 402 the specification of a circuit design is input. The specification may be in a hardware description language (HDL), for example. In one embodiment, selected modules of the HDL specification may be tagged as being modules that may be put to sleep. The tags may be language-supported compiler directives or comments in the code. In one embodiment, the compiler during place-and-route processing may move any static logic that cannot be put to sleep to areas of the programmable IC that will not be affected when the sub-circuit(s) that implements the target module is put to sleep.

At block 404, a configuration bitstream is generated to implement the circuit design on a programmable IC. For those modules designated as being eligible to be put to sleep and awakened, the process of block 406 is performed to generate partial bitstreams for clearing and setting the appropriate GWE mask configuration memory cells, and for deasserting and asserting the GWE signal.

At block 408, a partial bitstream is generated for clearing the GWE mask configuration memory cells that are associated with the sub-circuits that implement the module. At block 410, a partial bitstream is generated to include a shutdown command for deasserting the GWE signal. A partial bitstream is generated at block 412 to set the respective GWE mask configuration memory cells, and at block 414 a partial bitstream is generated to include a startup command for asserting the GWE signal. It will be appreciated that in generating the partial bitstreams, they are stored in a non-volatile storage medium for subsequent use.

Though FIG. 7 shows a process for generating partial bitstreams for putting to sleep and waking sub-circuit based on a specification of the target modules in the hierarchy of the design, it will be appreciated that the partial bitstreams could be alternatively generated from a flat design implementation flow. The flat flow would require some data that indicates which sub-circuits implement which modules of the circuit design.

In accordance with one or more embodiments, constraints may be used to specify which module(s) may be put to sleep. For example, constraints may be specified for modules A and B with the following instructions:

MODULE "My_Module_A" sleep=A
MODULE "My_Module_B" sleep=B

In response to these constraints, a bitstream generation process creates sleep and wake bitstreams for each of My_Module_A and My_Module_B. The sleep bitstream for My_Module_A powers down all components assigned to My_Module_A, and the sleep bitstream for My_Module_B powers down all components assigned to My_Module_B. The wake bitstream for My_Module_A powers up all components assigned to My_Module_A, and the wake bitstream for My_Module_B powers up all components assigned to My_Module_B. The "A" and "B" variables may be used to form unique names of the sleep and wake bitstreams. "Components" refers to elements of the named module.

The sleep constraint includes a sleep mode value that is associated with the referenced design entity. In an example embodiment, the sleep mode is specified with character string. A sleep mode value "NEVER" indicates that the design entity is never to be put to sleep; a sleep mode value "AUTO" indicates that dynamic or static power analysis algorithms may automatically set the sleep mode value. Sleep mode values other than NEVER or AUTO indicate that the design entity may be put to sleep.

One or more embodiments further support sub-portions of a module to be powered down while other parts of the module remain awake. The following constraints may be used to specify parts of a module that may be put to sleep:

INST "PCIE/BRAM*" sleep=PCIE
INST "PCIE/GT*" sleep=PCIE

In response to these constraints, the bitstream generator creates a sleep bitstream that would power down only the specified components (instances PCIE/BRAM and PCIE/GT) of "My_Module_A." A corresponding wake bitstream is also generated. The power control circuit could then make use of multiple power down bitstreams. Creating individual bitstreams for putting to sleep and waking different circuitry controls the bitstream size and thereby limits the time required to power down only those power hungry portions of a module.

In one embodiment, INST may be used on flat designs where there are no modules or hierarchy. In generating the initial full bitstream, a packer algorithm would place components to be put to sleep in circuitry of the programmable IC that can be powered down without affecting other components of the design.

The sleep mode may be used to ensure that certain logic is never powered down in order to maintain intra-module communication. A sleep mode value of NEVER specifies that the specified modules or instances are never powered down. The following example shows a particular instance constrained from being put to sleep:

INST "PCIE/IntraModuleHandShaking/*" sleep=NEVER

In placing components of the design and generating a configuration bitstream, the packer algorithm would not pack logic with a sleep mode value equal to NEVER in the same sub-circuit as logic with a sleep mode value other than NEVER. The NEVER sleep mode logic takes precedence over the AUTO sleep mode value. Thus, if a module is specified for auto-sleep, and a sub-module is specified to never be put to sleep, the sub-module will not be put to sleep while other parts of the module may be put to sleep if deemed to consume power by power analysis algorithms. Since dynamic power analysis may be performed after place and route to identify components that are suitable to be put to sleep (AUTO sleep mode), the dynamic power analysis algorithm would unpack from circuitry of the programmable IC the components of a module that cannot be put to sleep and components of the module that can be put to sleep.

Figure 8:
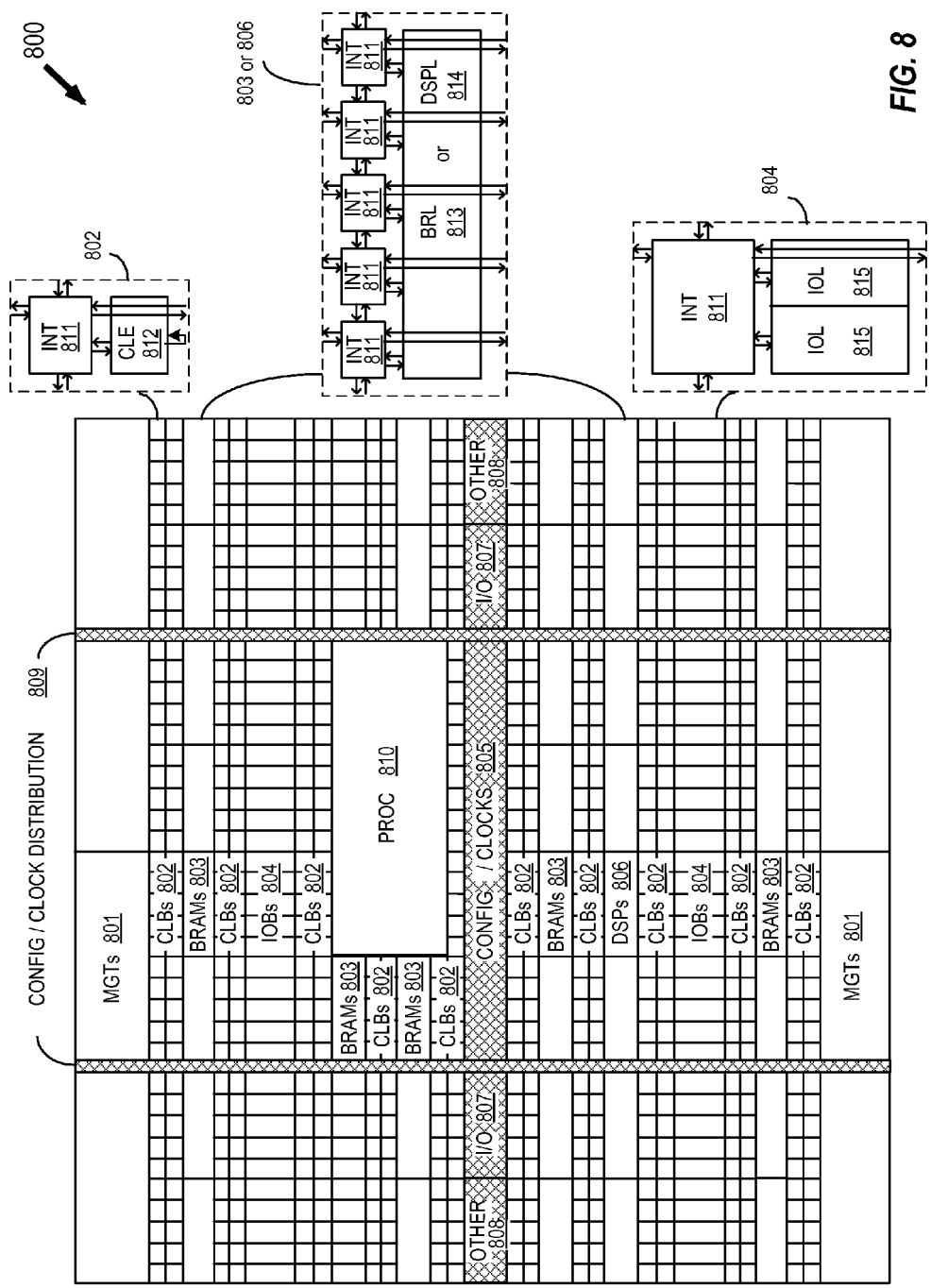
FIG. 8 is a block diagram of an example programmable logic integrated circuit that may be used in implementing a sleep mode for sub-circuits of a programmable IC.

FIG. 8 is a block diagram of an example programmable logic integrated circuit that may be used in implementing a sleep mode for sub-circuits of a programmable IC in accordance with various embodiments of the invention. FPGAs can include several different types of programmable logic blocks in the array. For example, FIG. 8 illustrates an FPGA architecture (800) that includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807), e.g., clock ports, and other programmable logic 808 such as digital clock managers, analog-to-digital converters, system monitoring logic, and so forth. Some FPGAs also include dedicated processor blocks (PROC 810), internal and external reconfiguration ports (not shown), and bus and/or network interfaces such as PCIe and Ethernet.

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element INT 811 also includes the connections to and from the programmable logic element within the same tile, as shown by the examples included at the top of FIG. 8.

For example, a CLB 802 can include a configurable logic element CLE 812 that can be programmed to implement user logic plus a single programmable interconnect element INT 811. A BRAM 803 can include a BRAM logic element (BRL 813) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 806 can include a DSP logic element (DSPL 814) in addition to an appropriate number of programmable interconnect elements. An 10B 804 can include, for example, two instances of an input/output logic element (IOL 815) in addition to one instance of the programmable interconnect element INT 811. As will be clear to those of skill in the art, the actual I/O pads connected, for example, to the I/O logic element 815 are manufactured using metal layered above the various illustrated logic blocks, and typically are not confined to the area of the input/output logic element 815.

In the pictured embodiment, a columnar area near the center of the die (shown shaded in FIG. 8) is used for configuration, clock, and other control logic. Horizontal areas 809 extending from this column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic.

Figure 9:
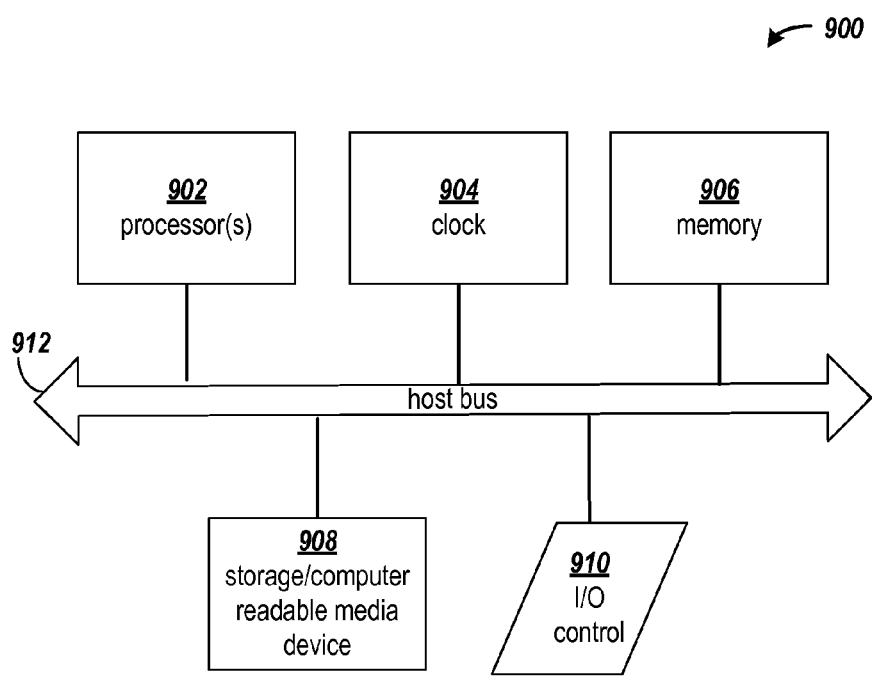
FIG. 9 shows a computing arrangement on which the process for generating an implementation of a circuit design may be hosted.

FIG. 9 shows a computing arrangement on which the process for generating an implementation of a circuit design may be hosted. Those skilled in the art will appreciate that various alternative computing arrangements, including one or more processors and a memory arrangement configured with program code, would be suitable for hosting the processes and data structures of the different embodiments. In addition, program code that implements the processes may be provided via a variety of computer-readable storage media or delivery channels such as magnetic or optical disks or tapes, electronic storage devices, as application services over a network, or a satellite up-link.

Computing arrangement 900 includes one or more processors 902 coupled to a memory/storage arrangement 906, retentive storage 908, and I/O control 910 via bus 912. The clock circuit 904 provides timing signals to the processor(s) and other components. The architecture of the computing arrangement depends on implementation requirements as would be recognized by those skilled in the art. The processor 902 may be one or more general purpose processors, or a combination of one or more general purpose processors and suitable co-processors, or one or more specialized processors (e.g., RISC, pipelined, etc.).

The memory/storage arrangement 906 and storage 908 is representative of hierarchical storage commonly found in computing arrangements. Such hierarchical storage typically includes multiple levels of cache memory, a main memory, and local and/or remote persistent storage such as provided by magnetic disks (not shown). The memory/storage arrangement may include one or both of local and remote memory/storage, remote storage being coupled to the processor arrangement via a local area network, for example.

The processor arrangement 902 executes the software stored in memory/storage arrangement 906 and storage 908, and reads data from and stores data to the memory/storage arrangement 906 and storage 908 according to the processes described above. An operating system (not shown) manages the resources of the computing arrangement.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

The embodiments are thought to be applicable to a variety of programmable integrated circuits. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A method of controlling power to a circuit, comprising:
   in response to determining that a first sub-circuit of a plurality of sub-circuits of a programmable IC is to be deactivated, deasserting a global write enable (GWE) signal, wherein the programmable IC includes a first plurality of configuration memory cells, and each configuration memory cell of the first plurality is associated with one sub-circuit of the plurality of sub-circuits and controls whether the sub-circuit is responsive to the GWE signal;
   in response to deassertion of the GWE signal and the first cell associated with the first sub-circuit being in a first state, disabling flip-flops in the first sub-circuit from changing state;
   in response to cells of the first plurality associated with sub-circuits other than the first sub-circuit being in a second state, enabling flip-flops in the sub-circuits other than the first sub-circuit to change state;
   in response to determining that the first sub-circuit is to be activated, asserting the GWE signal;
   preserving logic implemented by the first sub-circuit between the deasserting and the asserting of the GWE signal; and
   in response to assertion of the GWE signal and the first cell associated with the first sub-circuit being in the first state, enabling flip-flops in the first sub-circuit to change state.

2. The method of claim 1, further comprising:
inputting a first partial bitstream to the programmable IC, wherein the first partial bitstream includes a configuration command that deasserts the GWE signal; and
in response to determining that the first sub-circuit is to be activated, inputting a second partial bitstream to the programmable IC, wherein the second partial bitstream includes a configuration command that asserts the GWE signal.

3. The method of claim 2, wherein the first and second partial bitstreams are input from a circuit operating in programmable circuitry of the programmable IC.

4. The method of claim 3, wherein the first and second partial bitstreams are input from a circuit operating external to the programmable IC.

5. The method of claim 1, wherein the asserting the GWE signal includes inputting a signal to a startup block circuit instantiated on the programmable IC.

6. The method of claim 5, wherein the GWE signal is input from a circuit operating in programmable circuitry of the programmable IC.

7. The method of claim 1, wherein the disabling of flip-flops in the first sub-circuit from changing state and the enabling of flip-flops in the sub-circuits other than the first sub-circuit to change state is for the first sub-circuit and at least one of the others of the sub-circuits being in a shared clock domain.

8. The method of claim 1, wherein in response to assertion of the GWE signal and the first cell associated with the first sub-circuit being in the first state, enabling the flip-flops in the first sub-circuit to change state.

9. The method of claim 1, wherein the programmable IC includes a second plurality of configuration memory cells and a third plurality of configuration memory cells, each configuration memory cell of the second plurality is associated with one sub-circuit of the plurality of sub-circuits, respective subsets of the third plurality of configuration memory cells are associated with the sub-circuits, and each configuration memory cell of the second plurality controls whether or not the respective subset of configuration memory cells associated with one of the plurality of sub-circuits is eligible for partial reconfiguration; and
the method further including, in response to the configuration memory cell of the second plurality that is associated with the first sub-circuit being in a first state, preventing partial reconfiguration directed to the respective subset of configuration memory cells of the third plurality that is associated with the first sub-circuit.

10. The method of claim 1, wherein:
the programmable IC includes a second plurality of configuration memory cells, respective subsets of the third plurality of configuration memory cells are associated with the sub-circuits for specifying logic implemented by the sub-circuit; and
the preserving of logic implemented by the first sub-circuit includes preserving states of the respective subset of configuration memory cells associated with the first sub-circuit.

11. The method of claim 1, further comprising:
after asserting the GWE signal, inputting a first partial bitstream that configures the first cell associated with the first sub-circuit into the second state;
after asserting the GWE signal, inputting a second partial bitstream that configures a second cell associated with a second sub-circuit of the plurality of sub-circuits into the first state; and in response to determining that the second sub-circuit is to be deactivated, deasserting the global write enable (GWE) signal.

12. A method of generating an implementation of a circuit for a programmable integrated circuit (IC) from a circuit design having a plurality of modules, comprising:
using one or more processors to perform operations including:
generating a configuration bitstream that includes configuration data that configures a plurality of configuration memory cells of the programmable IC to implement the circuit design;
in response to a first module of the plurality of modules designated as supporting a sleep mode:
generating a first partial bitstream that clears one or more respective mask configuration memory cells associated with one or more sub-circuits of the programmable IC that implement the first module, wherein a state of the mask configuration memory cell controls whether or not the sub-circuit is responsive to a global write enable (GWE) signal;
generating a second partial bitstream that includes a command that deasserts the GWE signal;
generating a third partial bitstream that sets the one or more respective mask configuration memory cells; and
generating a fourth partial bitstream that includes a command that asserts the GWE signal.

13. An integrated circuit arrangement, comprising:
a plurality of programmable sub-circuits, each sub-circuit including one or more flip-flops;
a plurality of configuration memory cells coupled to the programmable sub-circuits, wherein for each sub-circuit:
states of configuration memory cells in a respective subset of the configuration memory cells specify a function implemented by the sub-circuit,
a state of a first one of the plurality of configuration memory cells respectively associated with the sub-circuit controls whether or not the one or more flip-flops in the sub-circuit is responsive to a global write enable (GWE) signal and the GWE signal controls whether or not the one or more flip-flops in the sub-circuit can change state; and
a state of a second one of the plurality of configuration memory cells respectively associated with the sub-circuit controls whether or not the respective subset of configuration memory cells associated with the sub-circuit is eligible for partial reconfiguration.

14. The circuit arrangement of claim 13, wherein the plurality of programmable sub-circuits and plurality of configuration memory cells are implemented on a programmable integrated circuit (IC), and the circuit arrangement further comprising:
a configuration circuit implemented on the programmable IC and coupled to the configuration memory cells;
a control circuit coupled to the configuration circuit, the control circuit configured and arranged to:
in response to determining that a first sub-circuit of a plurality of sub-circuits of the programmable IC is to be deactivated, input a first partial bitstream to the programmable IC, wherein the first partial bitstream includes a configuration command that deasserts the GWE signal; and
in response to determining that the first sub-circuit is to be activated, input a second partial bitstream to the programmable IC, wherein the second partial bitstream includes a configuration command that asserts the GWE signal.

15. The circuit arrangement of claim 14, wherein the control circuit is implemented in programmable circuitry of the programmable IC.

16. The circuit arrangement of claim 14, wherein the control circuit is implemented external to the programmable IC.

17. The circuit arrangement of claim 14, wherein states of the respective subset of the configuration memory cells that specify the function implemented by the first sub-circuit are preserved between the deassertion and assertion of the GWE signal.

18. The circuit arrangement of claim 13, wherein the plurality of plurality of programmable sub-circuits and plurality of configuration memory cells are implemented on a programmable integrated circuit (IC), and the circuit arrangement further comprising:
   a startup block implemented on the programmable IC and coupled to the programmable sub-circuits;
   a control circuit coupled to the startup block circuit, the control circuit configured and arranged to input a signal to the startup block circuit to assert the GWE signal.

19. The circuit arrangement of claim 18, wherein the control circuit is implemented in programmable circuitry of the programmable IC.

20. The circuit arrangement of claim 18, wherein states of the respective subset of the configuration memory cells that specify the function implemented by the first sub-circuit are preserved between the deassertion and assertion of the GWE signal.

* * * * *